(12) United States Patent
Kim

(10) Patent No.: US 7,649,307 B2
(45) Date of Patent: Jan. 19, 2010

(54) DISPLAY PANEL ASSEMBLY AND METHOD OF MANUFACTURING THE SAME

(75) Inventor: Sung Hee Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 390 days.

(21) Appl. No.: 11/643,986

(22) Filed: Dec. 22, 2006

(65) Prior Publication Data

US 2007/0290615 A1    Dec. 20, 2007

(30) Foreign Application Priority Data

Jun. 16, 2006    (KR)    ............ 10-2006-0054122

(51) Int. Cl.
*H01J 1/88* (2006.01)
(52) U.S. Cl. .............. 313/292; 313/252
(58) Field of Classification Search .............. 313/493, 313/512, 634, 238, 252, 292
See application file for complete search history.

(56) References Cited

U.S. PATENT DOCUMENTS

| 4,810,931 | A * | 3/1989 | McKenna et al. ...... 313/509 |
| 5,866,978 | A * | 2/1999 | Jones et al. ...... 313/495 |
| 6,268,071 | B1 * | 7/2001 | Yasukawa et al. ...... 428/690 |

* cited by examiner

*Primary Examiner*—Vip Patel
(74) *Attorney, Agent, or Firm*—Holland & Knight LLP

(57) ABSTRACT

A display panel assembly includes a first substrate having an effective display region for displaying an image and a non-effective display region positioned at a peripheral region outside of the effective display region, a second substrate facing the first substrate, a sealing member disposed along a boundary between the effective display region and the non-effective display region between the first and second substrates, the sealing member including a thermosetting material, and an exothermnic member interposed between the sealing member and the first substrate to generate heat for curing the sealing member.

12 Claims, 5 Drawing Sheets

DISPLAY PANEL ASSEMBLY AND METHOD OF MANUFACTURING THE SAME

This invention claims the benefit of Korean Patent Application No. 2006-054122 filed in Korea on Jun. 16, 2006, which is hereby incorporated by reference in its entirety.

BACKGROUND OF THE INVENTION

1. Field of the Invention

The embodiments of the invention relate to a display panel, and more particularly, a display panel assembly and method of manufacturing the same.

2. Description of the Related Art

In recent years, technological progress has developed information processing devices that can process a large amount of data within a short period of time. Accordingly, display devices capable of displaying such data as visual images has also rapidly progressed. The display devices, which display the quickly processed data as an image, are classified into analog display devices and digital display devices. A cathode ray tube (CRT) type display device is representative of an analog display devices. A liquid crystal display (LCD) device, an organic electroluminescent (EL) display device and a plasma display panel (PDP) are representative of digital display devices. Image generation through an analog display device, such as a CRT type display device has been widely used because of natural color rendering as well as a wide viewing angle. On the other hand, the digital display device are becoming more widely used because of their thin profile and light weight.

The digital display device, such as an LCD device, commonly includes a pair of substrates, display elements and a sealing member. The pair of substrates face each other with the display elements disposed between the pair of substrates. The sealing member seals the display elements within the pair of substrates as well as bonds the substrates together. More particularly, the sealing member isolates the display elements of the digital display devices from an external environment. Thus, if the sealing member is damaged, the digital display devices may fail to display an image.

The sealing member can contain a thermosetting material cured by an applied heat. However, if the sealing member contains a thermosetting material, the display elements of the display device may be damaged while the sealing member is cured due to the outgases from the curing sealing member. Alternatively, the sealing member can contain a photocurable material such that the sealing member can contain an ultraviolet-curable material cured by ultra violet. However, if the sealing member is cured using light, such as ultraviolet light, the display elements of the digital display device may be damaged due reactivity with ultraviolet light.

To overcome the aforementioned drawbacks, the related art employs a method of using a mask to radiate ultraviolet light only onto the sealing member region to cure the sealing member material. However, in recent years, as the length of substrates used for manufacturing the digital display devices increases to 2,000 mm, manufacturing of a mask to selectively expose the sealing member region becomes more difficult. Further, the process of depositing the sealing member material, aligning the mask, curing the sealing member and then removing the mask is a complicated and takes a long period of time.

SUMMARY OF THE INVENTION

Accordingly, the invention is directed to a display panel assembly and method of manufacturing the same that substantially obviates one or more problems due to limitations and disadvantages of the related art.

An object of embodiments of the invention is to provide a display panel assembly having a sealing member selectively cured by heat.

Another object of embodiments of the invention is to provide a method of manufacturing the above display panel assembly.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a display panel assembly includes a first substrate having an effective display region for displaying an image and a non-effective display region positioned at a peripheral region outside of the effective display region, a second substrate facing the first substrate, a sealing member disposed along a boundary between the effective display region and the non-effective display region between the first and second substrates, the sealing member including a thermosetting material, and an exothermic member interposed between the sealing member and the first substrate to generate heat for curing the sealing member.

In another aspect, a method of manufacturing a display panel assembly, the method includes forming an exothermic member generating heat using an electric resistance along a non-effective display region formed at a peripheral region adjacent to an effective display region of a first substrate, disposing a fluidic sealing material including a thermosetting material cured by heat on the exothermic member to form a preliminary sealing member, aligning a second substrate on the preliminary sealing member, and curing the preliminary sealing member to form a sealing member by supplying power to the exothermic member to generate a heat.

It is to be understood that both the foregoing general description and the following detailed description of embodiments of the invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENTS

Reference will be made in detail to the preferred embodiments of the invention, examples of which are illustrated in the accompanying drawings. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the accompanying drawings, the dimensions of a first substrate, a second substrate, a sealing member, an exothermic member and other elements are exaggerated for clarity. It will be understood that when the first substrate, the second substrate, the sealing member, the exothermic member and other elements are referred to as being "on", "over" or "below" another layer or substrate, they can be directly on the other element or substrate, or another substrates, sealing member, exothermic member and other elements may also be present. It will also be understood that although the terms "first" and "second" are used herein to describe first substrate, second substrate and other elements, these regions, layers and/or sections should not be limited by these terms. These terms are only used to distinguish one substrate, element or section from another substrate, element or section. Thus, for example, the terms "first" and "second" can be alternatively or exchangeably used for the first and second substrates and other elements.

Figure 1:
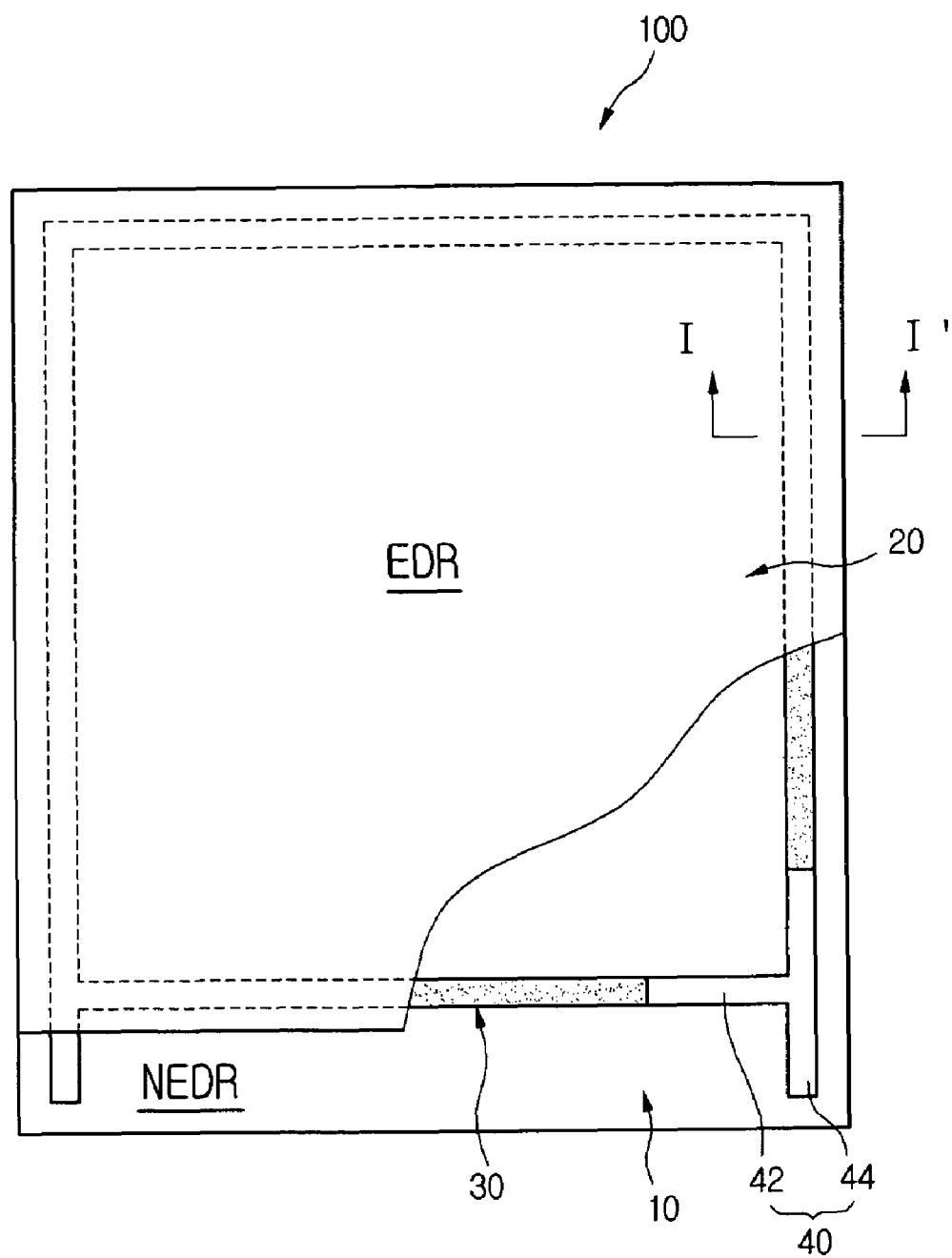
FIG. 1 is a plan view illustrating a display panel assembly according to an embodiment of the invention.
Figure 2:
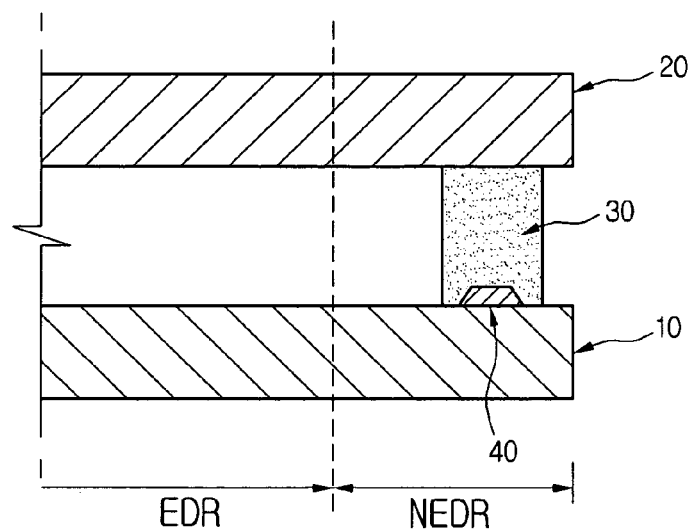
FIG. 2 is a cross-sectional view taken along the line I-I' in FIG. 1.

FIG. 1 is a plan view illustrating a display panel assembly according to an embodiment of the invention, and FIG. 2 is a cross-sectional view taken along the line I-I' in FIG. 1. Referring to FIGS. 1 and 2, a display panel assembly 100 includes a first substrate 10, a second substrate 20, a sealing member 30 and an exothermic member 40. The first substrate 10 can be a transparent plate, such as glass, through which light can transmit.

The first substrate 10 has an effective display region (EDR) and a non-effective display region (NEDR). More particularly, the EDR is a region of the substrate 10 on which an image is displayed, and the NEDR is defined as a region of the substrate 10 on which an image is not displayed. The EDR is disposed at a center portion of the first substrate 10 and can have a rectangular shape in a plan view. On the other hand, the NEDR is disposed at the periphery of the EDR Referring again to FIGS. 1 and 2, the first substrate 10 and the second substrate 20 are facing each other. The second substrate 20 can also be a transparent plate, such as glass, through which light can transmit. The sealing member 30 may be interposed between the first and second substrates 10 and 20. More specifically, the sealing member 30 can be formed along a boundary between the EDR and the NEDR of the first substrate 10. Accordingly, the sealing member 30 can have a closed loop shape in a plan view.

The sealing member 30, the first substrate 10 and the second substrate 20 form a sealing space between the first and second substrates 10 and 20. Display elements for displaying an image are arranged in the sealing space. In addition, the sealing member 30 functions to prevent oxygen and/or moisture from contacting the display elements formed in the sealing space and also prevents a display material, for example, plasma, liquid crystal or the like interposed between the first and second substrates 10 and 20 from leaking out of the sealing space. The sealing member 30 can include a thermosetting material, which is curable by heat.

As shown in FIG. 2, an exothermic member 40 can also be interposed between the first substrate 10 and the sealing member 30. The exothermic member 40 generates heat for curing the sealing member 30 of thermosetting material. Referring again to FIG. 1, the exothermic member 40 can have an exothermic body 42 and a contact portion 44. The exothermic body 42, in a plan view, can have a shape corresponding to the sealing member 40. The contact portion 44 can be formed integrally with the exothermic body 42 and protrude from the exothermic body 42 at a predetermined length.

The contact portion 44 is electrically connected to an external power supply (not shown) so that external power can be supplied to the contact portion 44. The contact portion 44 may be protrude from at least two portions of the exothermic body 42. For example, a power having positive (+) polarity is applied to one contact portion 44 and a power having negative (−) polarity is applied to the other contact portion 44. Thus, Joule heat is generated by the exothermic body 42. The Joule heat generated by the exothermic body 42 is transferred to the adjacent sealing member 30 so that the sealing member having the thermosetting material is cured by the Joule heat. Since the exothermic member 40 is selectively formed in correspondence with the sealing member 30, the exothermic member 40 quickly and directly heats the sealing member 30 without any significant heat transfer to the display elements that can damage the display elements. Examples of a material that may be used as the exothermic member 40 include indium tin oxide (ITO), indium zinc oxide (IZO), and amorphous indium tin oxide (a-ITO). Alternatively, the exothermic member 40 can include a metal or metal alloy having electrical resistance similar to that of the ITO, IZO, and a-ITO.

To generate more heat from the exothermic body 42, the exothermic body 42 may have a width regularly or irregularly decreased along its length direction in a plan view to increase the electrical resistance according to the shape of the exothermic body 42. Alternatively, more heat can be generated from the exothermic body 42 by having the thickness of the exothermic body 42 regularly or irregularly decrease to increase the electrical resistance. Areas of increased resistance should coincide with portions of the sealing member 30 that are to be cured.

Figure 3:
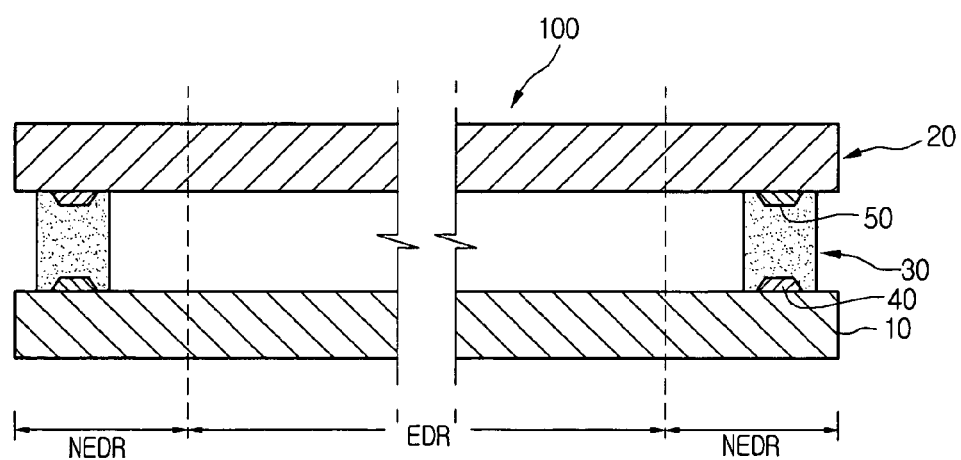
FIG. 3 is a cross-sectional view of a display panel assembly according to another embodiment of the invention having two exothermic members.

FIG. 3 is a cross-sectional view of a display panel assembly according to another embodiment of the invention having two exothermic members. Referring to FIG. 3, a display panel assembly 200 includes a first substrate 10, a second substrate 20, a sealing member 30, an exothermic member 40, and an additional exothermic member 50. The first substrate 10 and the second substrate 20 face each other. The sealing member 30 is interposed between the first and second substrates 10 and 20. The sealing member 30 is disposed along a boundary between the EDR and the NEDR of the first substrate 10.

To cure a thermosetting material included in the sealing member 30, an exothermic member 40 is interposed between the first substrate 10 and the sealing member 30 and an additional exothermic member 50 is interposed between the second substrate 20 and the sealing member 30. Examples of a material that may be used as the exothermic members 40 and 50 include ITO, IZO, and a-ITO.

The additional exothermic member 50 further reduces the curing time for completely cure the sealing member 30. More particularly, the time taken to cure the sealing member 30 contacting the first and second substrates 10 and 20 through the exothermic member 40 and the additional exothermic member 50 is reduced by half compared to the use of only a single exothermic member 40. Because of the reduced curing time, the possibility of heat leakage to other parts of the display panel assembly 200.

Figure 4:
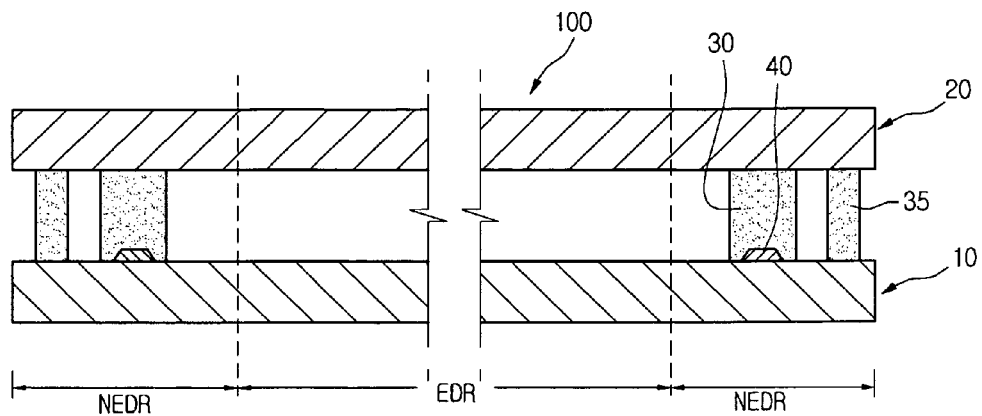
FIG. 4 is a cross-sectional view illustrating a display panel assembly according to another embodiment of the invention having an additional sealing member.

FIG. 4 is a cross-sectional view illustrating a display panel assembly according to another embodiment of the invention having an additional sealing member. Referring to FIG. 4, a display panel assembly 300 includes a first substrate 10, a second substrate 20, a sealing member 30, an additional sealing member 35 and an exothermic member 40. The first substrate 10 and the second substrate 20 face each other. The sealing member 30 is interposed between the first and second substrates 10 and 20. The sealing member 30 is disposed along a boundary between the EDR and the NEDR of the first substrate 10.

To cure a thermosetting material included in the sealing member 30, the exothermic member 40 is disposed between the first substrate 10 and the sealing member 30. Examples of a material that can be used as the exothermic member 40 include ITO, IZO and a-ITO. An additional sealing member 35 is interposed between the first substrate 10 and the second substrate 20. The additional sealing member 35 is, for example, disposed on the NEDR of the first substrate 10 outside of the sealing member 30. The additional sealing member 35 can have a closed loop shape in a plan view. The additional sealing member 35 may, for example, include a photocurable material or a thermosetting material. Alternatively, if the additional sealing member 35 includes a thermosetting material, additional exothermic members 48 can be disposed between the additional sealing member 35 and the first substrate 10 and between the additional sealing member 35 and the second substrate 20. The additional sealing member 35 provides added sealing capacity for protecting the display panel assembly 300.

Figure 5:
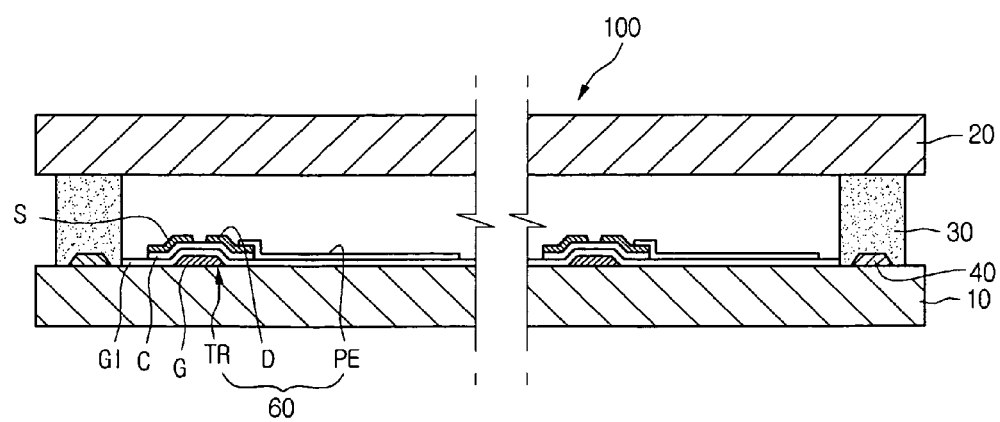
FIG. 5 is a cross-sectional view illustrating an LCD display panel assembly according to another embodiment of the invention.

FIG. 5 is a cross-sectional view illustrating an LCD display panel assembly according to another embodiment of the invention. Referring to FIG. 5, the display panel assembly 400 shown in FIG. 5 includes a first substrate 10, a second substrate 20, a sealing member 30, an exothermic member 40, and a display element 60 having thin film transistors Tr and pixel electrodes PE. The thin film transistors Tr are disposed on the first substrate 10 corresponding to the resolution of the display panel assembly 100. For example, when the resolution of the display panel assembly is 1024×768, 1024×768×3 thin film transistors TR are arranged on the first substrate 10 in a matrix configuration.

Each thin film transistor TR includes a gate electrode G connected to a gate line (not shown), a gate insulating layer GI insulating the gate electrode G, a channel layer C formed at a portion covering the gate electrode G, and a source/drain electrode S/D disposed on the channel layer C. The channel layer C may include an amorphous silicon pattern (not shown) and an n+ amorphous silicon pattern (not shown) doped with a high concentration of conductive impurities so as to have a conductive property. In addition, the source electrode S is connected with a data line (not shown) substantially perpendicular to the gate line, and the source electrode S and the drain electrode D are spaced apart from each other by a predetermined interval.

The pixel electrode PE is electrically connected to the drain electrode D of the thin film transistor TR. The pixel electrode PE can include a transparent conductive material. Examples of a transparent conductive material that can be used as the pixel electrode PE include indium tin oxide (ITO), indium zinc oxide (IZO), and amorphous indium tin oxide (a-ITO). The exothermic member 40 and the pixel electrode PE are disposed on the same plane. The exothermic member 40 and the pixel electrode PE are formed together by the same patterning process. A black matrix having a matrix configuration may be formed on the second substrate 20, a color filter (not shown) can be disposed corresponding to the pixel electrode PE, and a liquid crystal layer (not shown) can be formed between the first and second substrates 10 and 20.

Figure 6:
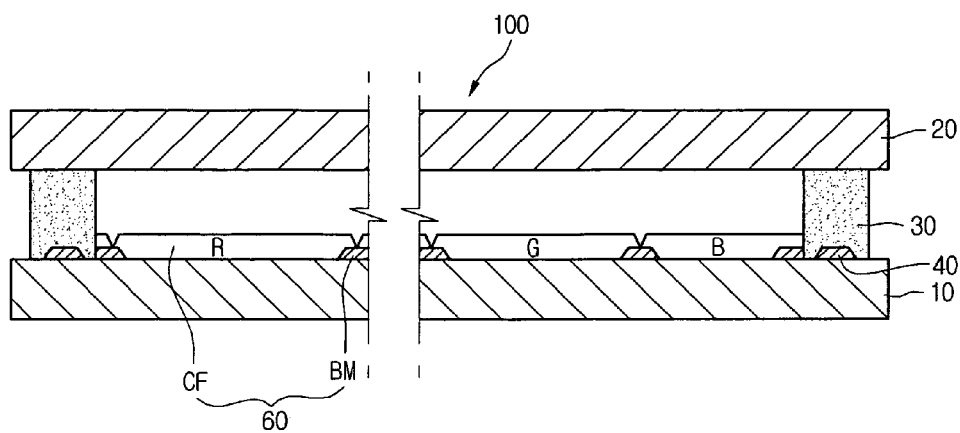
FIG. 6 is a cross-sectional view illustrating a display panel assembly having a black matrix and a color filter according to another embodiment of the invention.

FIG. 6 is a cross-sectional view illustrating a display panel assembly having a black matrix and a color filter according to another embodiment of the invention. Referring to FIG. 6, a display panel assembly 500 includes a first substrate 10, a second substrate 20, a sealing member 30, an exothermic member 40, and a display device 60 having a black matrix BM and a color filter CF. The black matrix BM having a matrix configuration is disposed on the first substrate 10. The black matrix BM functions to absorb an external light to enhance the definition of an image. Examples of a material having a high light absorption that may be used as the black matrix include chromium and/or chromium oxide.

The color filter CF is disposed at each opening formed by the black matrix BM having the matrix configuration. The color filter CF is disposed in each opening formed by the black matrix BM. The color filter CF includes a red (R) color filter that passes a red light having a red wavelength from a white light, a green (G) color filter that passes a green light having a green wavelength from the white light, and a blue (B) color filter that passes a blue light having a blue wavelength from the white light.

A pixel electrode (not shown) on the second substrate 20 faces the color filter CF. A thin film transistor, which is electrically connected with the pixel electrode, can be formed on the second substrate 20. Further, a liquid crystal layer may be interposed between the first and second substrates 10 and 20.

Figure 7:
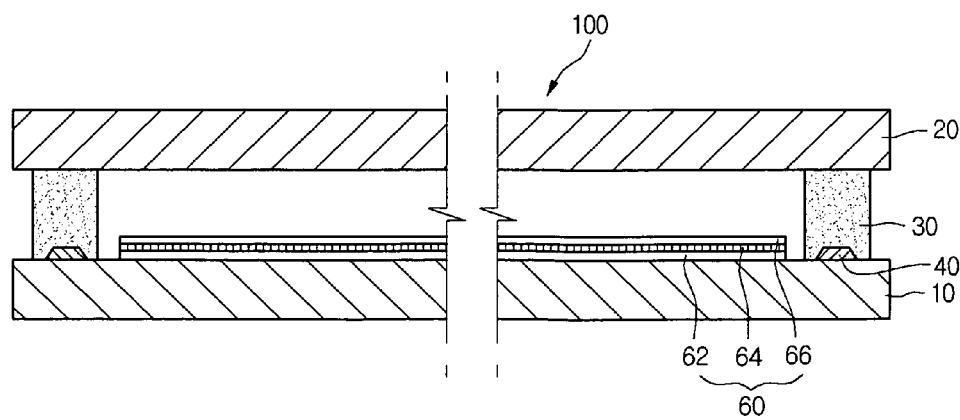
FIG. 7 is a cross-sectional view illustrating a display panel assembly having an organic light emitting layer according to another embodiment of the invention.

FIG. 7 is a cross-sectional view illustrating a display panel assembly having an organic light emitting layer according to another embodiment of the invention. Referring to FIG. 7, a display panel assembly 600 includes a first substrate 10, a second substrate 20, a sealing member 30, an exothermic member 40, and a display device 60. The display device 60 includes a first electrode 62, an organic light emitting layer 64 and a second electrode 66. The first electrode 62 may be disposed on the first substrate 10, the organic light emitting layer 64 is formed on the first electrode 62, and the second electrode 66 may be formed on the organic light emitting layer 64. Each of the first and second electrodes 62 and 66 can be made of one of, for example, indium tin oxide (ITO), indium zinc oxide (IZO), amorphous indium tin oxide (a-ITO), aluminum (Al), and aluminum alloy.

Figure 8:
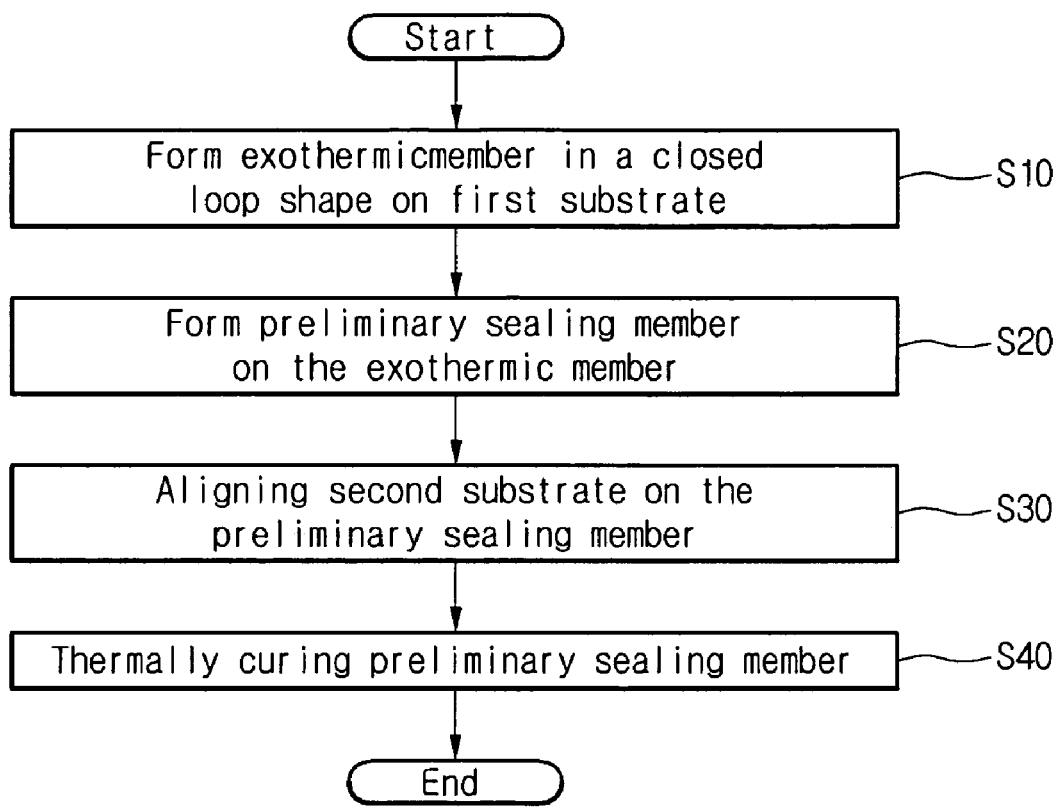
FIG. 8 is a flow diagram illustrating a method of manufacturing a display panel assembly according to an embodiment of the invention.

FIG. 8 is a flow diagram illustrating a method of manufacturing a display panel assembly according to an embodiment of the invention. Referring to FIG. 8, in step S10, a display device for displaying an image is formed within an effective display region (EDR) on a first substrate, such as a glass substrate, so as to manufacture a display panel assembly. While the display device is formed within the EDR, an exothermic member is formed on a non-effective display region (NEDR). Examples of a material that may be used as the exothermic member include indium tin oxide (ITO), indium zinc oxide (IZO), and metal.

Next, as shown in step S20, after the exothermic member is formed on the NEDR, a preliminary sealing member, including a thermosetting material, is formed on the exothermic member.

Next, as shown in step S30, a second substrate facing the first substrate is disposed on the preliminary sealing member and then the preliminary sealing member to attach the second substrate to the first substrate. Before the second substrate is attached to the preliminary sealing member, an additional exothermic member similar to the exothermic member formed on the first substrate can be further formed on a portion of the second substrate attached to the preliminary sealing member.

Next, as shown in step S40, power is supplied to the exothermic member, so that the exothermic member generates a Joule heat due to the resistance of the exothermic member. The sealing member, including the thermosetting material, is cured by the Joule heat generated by the exothermic member.

As described above, a sealing member, including a thermosetting material, can seal a pair of substrates of a display panel assembly as a result of the exothermic member generating heat due to power being supplied to the exothermic member. Accordingly, the exothermic member enables curing of the sealing member without a mask or other process procedures. Further, the curing of the sealing member can occur quickly without affecting other components of the display panel assembly.

It will be apparent to those skilled in the art that various modifications and variations can be made in the embodiments of the invention without departing from the spirit or scope of the invention. Thus, it is intended that embodiments of the invention cover the modifications and variations of this invention provided they come within the scope of the appended claims and their equivalents.

What is claimed is:

1. A display panel assembly comprising:
    a first substrate having an effective display region for displaying an image and a non-effective display region positioned at a peripheral region outside of the effective display region;
    a second substrate facing the first substrate;
    a sealing member disposed along a boundary between the effective display region and the non-effective display region between the first and second substrates, the sealing member including a thermosetting material; and
    a first member interposed between the sealing member and the first substrate to generate heat for curing the sealing member.

2. The display panel assembly according to claim 1, wherein the first member includes an first body having substantially a same shape as that of the sealing member in a plan view and a contact section protruding from the first body for supplying power to the first body.

3. The display panel assembly according to claim 1, wherein the first member is formed of at least one of indium tin oxide, indium zinc oxide and amorphous indium tin oxide.

4. The display panel assembly according to claim 1, further comprising a second member disposed between the second substrate and the sealing member for curing the sealing member.

5. The display panel assembly according to claim 4, wherein the second member has substantially a same shape as that of the sealing member in a plan view and an additional contact section protruding from the additional second body for supplying power to the additional second member.

6. The display panel assembly according to claim 4, wherein the second member is formed of at least one of indium tin oxide, indium zinc oxide and amorphous indium tin oxide.

7. The display panel assembly according to claim 1, further comprising an additional sealing member disposed outside of the sealing member disposed on the first member.

8. The display panel assembly according to claim 1, wherein the first substrate has a thin film transistor and a pixel electrode electrically connected to an output terminal of the thin film transistor.

9. The display panel assembly according to claim 1, wherein the first substrate has a black matrix arranged in a matrix configuration and a color filter disposed in an opening of the black matrix.

10. The display panel assembly according to claim 1, wherein the first substrate has a first electrode, a second electrode facing the first electrode, and an organic light emitting layer interposed between the first electrode and the second electrode.

11. The display panel assembly according to claim 1, wherein the first member has a width regularly reduced in a plan view so as to augment an amount of the heat generated from the additional first member.

12. The display panel assembly according to claim 1, wherein the first member has a thickness regularly reduced as viewed in a section so as to augment an amount of the heat generated from the first member.

* * * * *